United States Patent [19]
Brandt et al.

[11] Patent Number: 5,488,314
[45] Date of Patent: Jan. 30, 1996

[54] BUCKLING BEAM TEST PROBE ASSEMBLY

[75] Inventors: Wolfram Brandt, Sindelfingen; Bernd Marquart, Weil im Schoenbuch; Roland R. Stoehr, Nufringen, all of Germany

[73] Assignee: International Business Machines Corporation, Armonk, N.Y.

[21] Appl. No.: 209,577

[22] Filed: Mar. 10, 1994

[30]    Foreign Application Priority Data

Jul. 23, 1993  [EP]  European Pat. Off. ............... 93111786

[51] Int. Cl.⁶ ............................ G01R 1/04; G01R 1/073
[52] U.S. Cl. ........................................... 324/758; 324/72.5
[58] Field of Search ................................... 324/756, 757, 324/758, 759, 760, 72.5, 73 PC

[56]                References Cited

U.S. PATENT DOCUMENTS 4,816,754  3/1989  Buechele et al. .................... 324/158 F
4,843,315  6/1989  Bayer et al. ......................... 324/158 P
4,901,013  2/1990  Benedetto et al. ................... 324/158 F
5,066,907  11/1991 Tarzwell et al. ..................... 324/158 P
5,175,496  12/1992 Collins et al. ....................... 324/158 P

FOREIGN PATENT DOCUMENTS 0068493    6/1981  European Pat. Off. ..
0233511    1/1987  European Pat. Off. ..
WO90/13039 4/1989  European Pat. Off. ..

Primary Examiner—Kenneth A. Wieder
Assistant Examiner—Barry C. Bowser
Attorney, Agent, or Firm—H. Daniel Schnurmann

[57]                  ABSTRACT

A buckling beam test probe assembly for the electrical test of integrated circuit devices is provided having contact probes made of a composite material and a stripper plate constructed so as to allow scrubbing and controllable wiping of the contact probe on the surface of the device to be tested. The assembly is designed for the maximum number of expected contact probes. Only the contact probe compartments which are needed for testing the devices are populated.

18 Claims, 6 Drawing Sheets

BUCKLING BEAM TEST PROBE ASSEMBLY

FIELD OF THE INVENTION

The present invention relates generally to a test probe assembly for the electrical test of devices, and more particularly, to a probe assembly for testing integrated circuits (ICs) having high contact density, i.e., a large number of contact pads.

BACKGROUND OF THE INVENTION

Membrane cards and needle cards have been successfully used to test integrated chips, wafers, and multichip modules. Needle cards consist of a number of radially arranged resilient needles which exactly correspond to the test points of the IC to be contacted. Since contact with the IC is made by means of these needles, a new card needs to be manufactured for each contact pattern or footprint of the IC pads. Depending on the number of needles, different designs are necessary. If, e.g., 300 needles are used to test a device, it may become necessary to arrange these needles in as many as three levels, since only a limited number of them can be compressed in one ring. Adjusting the needles in a three level formation necessitates a considerable amount of manual work due to an accuracy requirement of the needle tips of about 5 µm. Additionally, the needles are highly sensitive to damage and misadjustment, since they are not mechanically guided over a relatively long distance.

The ever increasing contact density and number of contacts required by more advanced IC generations further limits the use of needle cards. Moreover, it is not always possible to cover the total area of a test card with contact needles, a conclusion which also holds true for membrane cards presently being developed. Although it is possible to create ICs with a very dense arrangement of contact pads, no adequate system exists at present for testing such chips.

Towards the latter part of the 1980s, buckling beam test probe assemblies were introduced. European patent 165331 describes a contact probe arrangement for electrically connecting a test system to the contact pads of a device to be tested, in which wires of highly electrical conductivity and resilient material are used as contact probes. These contact probes are placed onto the contact pads of the device and put under axial stress to achieve low contact resistance, thereby allowing the probes to buckle laterally. This lateral buckling is advantageous since it provides a way to adapt to irregularities in the surface of the device to be tested. The buckling contact probes also adapt to different heights of the contact pads.

U.S. Pat. No. 4,843,315 of common assignee discloses a contact probe arrangement that includes a stack of perforated plates through which extend into a plurality of contact probes. This stack consists of two kinds of plates. The first is provided with circular or square holes permitting a vertical placement of the contact probes onto the contact pads of the device to be tested. The plates of the second kind have oblong, rectangular, square, circular, elliptical or trapezoidal holes. With respect to the second kind, alternating plates are offset with respect to adjacent plates and which, in turn, are aligned with respect to each other. The alignment is such that if axial stress is applied, the contact probe cannot buckle further than the section of the perforation wall limiting maximum buckling. However, neither the needle cards nor the buckling beam contact probe arrangements solve the problem of contacting dense arrangements of contact pads below a 180 µm pitch. Exact positioning of the contact probes is required to allow burn-in simultaneously with conducting pure electrical tests. Furthermore, known assemblies are highly sensitive to misadjustments as well as damage.

OBJECTS OF THE INVENTION

It is therefore an object of the present invention to provide a test probe assembly capable of servicing the ever increasing density of contact pads found in more advanced ICs.

It is another object of the present invention to provide a test probe assembly capable of handling small geometries, i.e., contact pad patterns densely spaced in the order of <100 µms.

It is a further object of the present invention to provide a test probe assembly capable of contacting the total IC area instead of only its periphery.

It is yet another object of the present invention to provide a test probe assembly with high transmission speeds when compared to comparable state of the art assemblies.

It is still a further object of the present invention to test an assembly which is immune to misalignments of the contact pads and which is insensitive to damages of the IC being tested.

The above and other objects of the invention are satisfied by a buckling beam test probe assembly for electrically testing a device provided with a plurality of contact pads, comprising: current carrying electrically conductive contact probes, each of the probes including an inner core surrounded by an outer sheath; a stack of perforated plates, wherein each of the probes passes through one perforation in each of the perforated plates; and a stripper plate positioned under the perforated plates, comprised of sections that are offset with respect to each other, the stripper plate being further provided with guiding channels so that probes passing through the guiding channels are deflected laterally by an amount determined by the offset and by the diameter of the channels, thereby providing each of the probes with controllable wiping of the contact pads.

BRIEF DESCRIPTION OF THE DRAWINGS

The invention will be described in more detail hereinafter with respect to the accompanying figures, wherein.

DESCRIPTION OF THE PREFERRED EMBODIMENT

The test probe assembly according to the invention is based on the known buckling beam principle.

Figure 1:
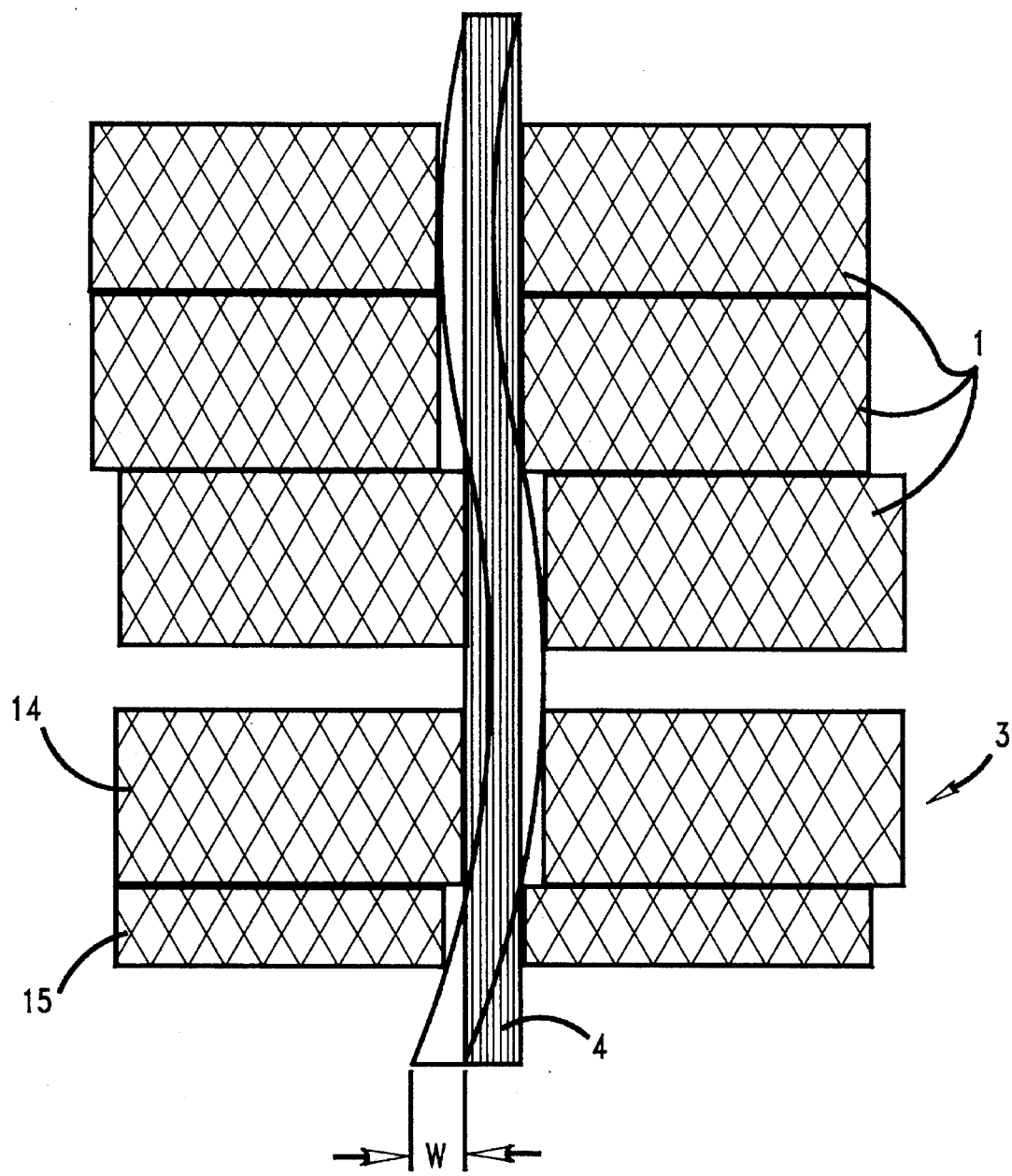
FIG. 1 is a schematic illustration of the test probe assembly in accordance with the present invention.

Referring to FIG. 1, the upper plates 1 of the assembly are made of high-temperature-stable polymer material (e.g. VESPEL®, DELRIN®). The stripper plate 3 can likewise also be made of a polymer material and, preferably, of silicon.

Figure 2:
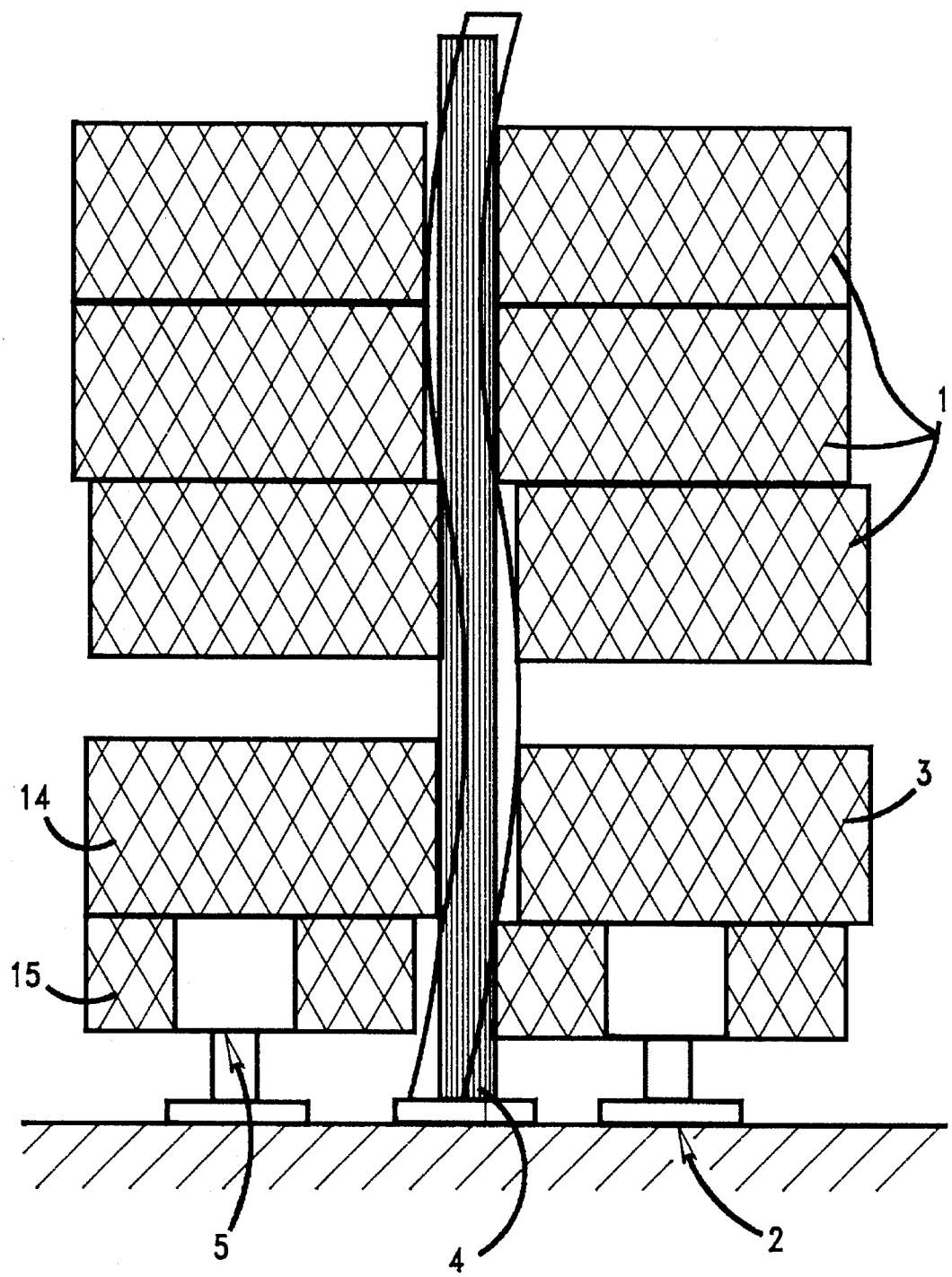
FIG. 2 shows the support of the test probe assembly on the device to be tested by stand-offs.

While testing IC pads 2 (FIGS. 2 and 3), higher temperatures are increasingly applied to the assembly to enhance the quality of the test. When the stripper plate 3 is made of silicon, it expands to the same degree as the IC, which is also made of silicon. Practitioners of the art will readily appreciate that slip-off of the contact probes 4 during test due to a mismatch of thermal coefficients is thereby eliminated.

Furthermore, a more exact positioning of the contact probe 4 becomes possible when using silicon where typically accuracies below 2 μm can be achieved, whereas equivalent values of about 10 μm can only be attained when polymers are used. Likewise, the stripper plate can also be made of polymer material (VESPEL®, DELRIN®) instead of silicon. This is particularly advantageous where temperatures are applied in a range where different thermal coefficients do not play an important role and/or when high accuracies are not required. Since the contact probes 4 are mechanically guided directly to their respective tips, the contact assembly is very robust and insensitive to damage or misadjustments.

In contrast to state of the art buckling beam probes, the probe according to the present invention does not support itself on the device under test across the entire surface of the stripper plate. Support is facilitated by stand-offs 5 (FIG. 2) which are arranged in the same array configuration as the IC pads 2 and bearing the same height as contact probes 4. No axial movement between stripper plate 3 and contact probes 4 occurs while contacting the IC. Therefore, no wear and subsequent debris generation of the contact probes takes place, thereby eliminating contamination of the highly sensitive IC.

In order to contact devices reliably, it is important that isolating layers (oxides) which are formed on the IC pads be penetrated. With conventional buckling beam probes this is achieved by applying a comparatively high contact pressure as compared to conventional cantilever needle cards. When using cantilever needle cards, penetration is achieved by scrubbing or wiping. The contact needle rubs over the pad when contacting and wipes away and through the oxide. However, due to differences in the length of the needles, the amount of wiping differs for each needle. Since no individual control is possible, it can result in electrical shorts during testing. Moreover, the wiping distance is a function of the amount of infeed of the needle card in the direction of contact, resulting in pad damage when the maximum length is exceeded or, at best, a sliding off of the needle from the contact pad.

Figure 3:
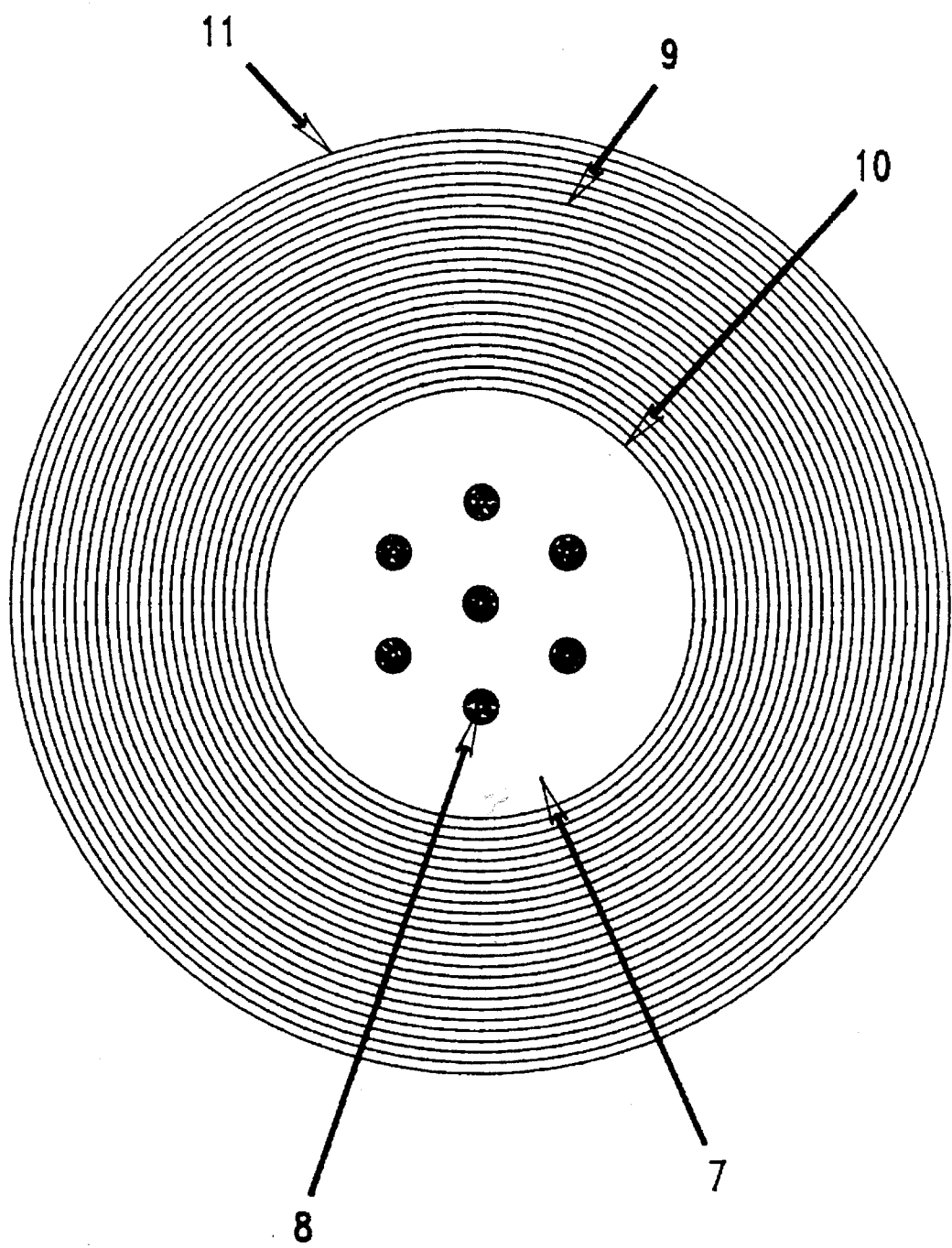
FIG. 3 shows a cross-sectional view of a typical contact probe according to the present invention.
Figure 4:
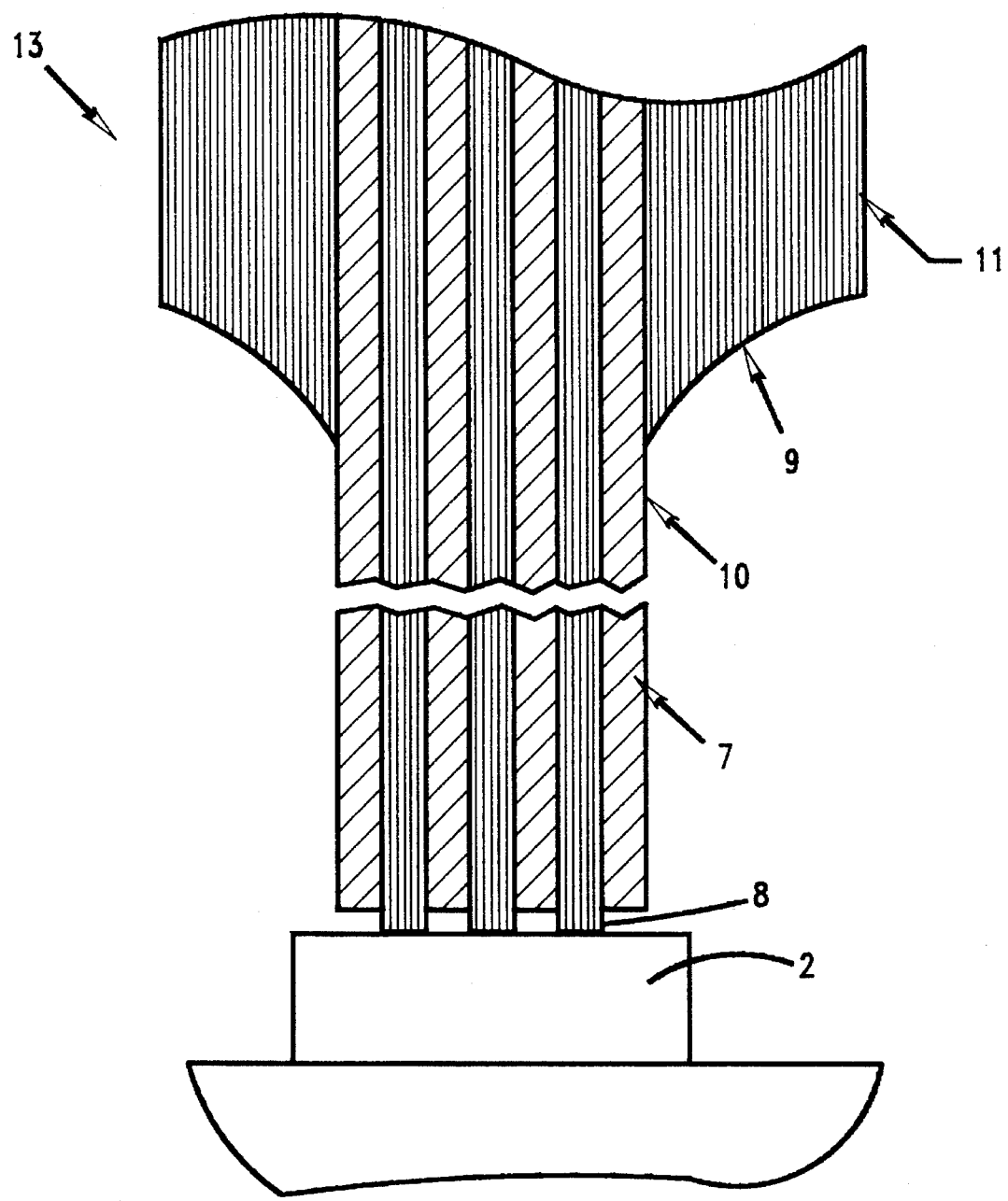
FIG. 4 shows a more detailed view of a typical contact probe shown in FIG. 3.

With the test probe assembly according to the present invention, an exactly controllable wiping is achieved in contrast to needle cards. This is achieved by the special form of the contact probe guiding channels in the stripper plate 3. The guiding channels of the stripper plate are offset in their lowest section with respect to the section immediately above it. When an axial force is applied, the probes are deflected laterally in the amount dictated and allowed by the offset described. This deflection causes wiping and penetration of the isolating oxide layer. By choosing appropriate dimensions of the contact probe guiding channels, this deflection (w in FIG. 1) is predictable and is independent of the infeed of the test probe assembly in the direction of the contact. Typical offset dimensions of stripper channels are 5 μm to 10 μm. The contact probes 4 are made of a composite material. The cross-section is constructed as shown in FIGS. 3 and 4.

Core 7, preferably made of Cu—Be due to its advantageous mechanical properties, constitutes the actual resilient buckling beam. Within the core, a plurality of Ag—Pd fibers 8 are arranged, (preferably 7). These fibers improve the contacting characteristics of the probe. They are preferably arranged so as to slightly protrude from the core (FIG. 4). Due to their hardness and shape, the fibers similar to dendrites are able to penetrate the oxide much easier than a planar area of Cu—Be. The fibers have each a diameter of 2–10 μm. Since the contacting force is concentrated on the Ag—Pd fibers, the desired contact behavior is achieved and damage to the contact points of the IC-pad is drastically reduced.

A sheath comprising a highly electrical conductive material, preferably pure Cu or Ag 9 is arranged around the core, thus enlarging the cross-section and reducing the ohmic resistance of the contact probe. The sheath is separated from the Cu—Be core by a thin nickel layer 11, acting as an etch stop layer. It is stripped by etching to the Cu—Be core within the area 12 of the plates 1 and it is maintained in the area 13 behind these plates. The thin cross-section of the Be—Cu wire allows a dense arrangement of the contact tips. Finally, the complete contact probe assembly is insulated by a polyimide insulation layer 11.

Figure 5:
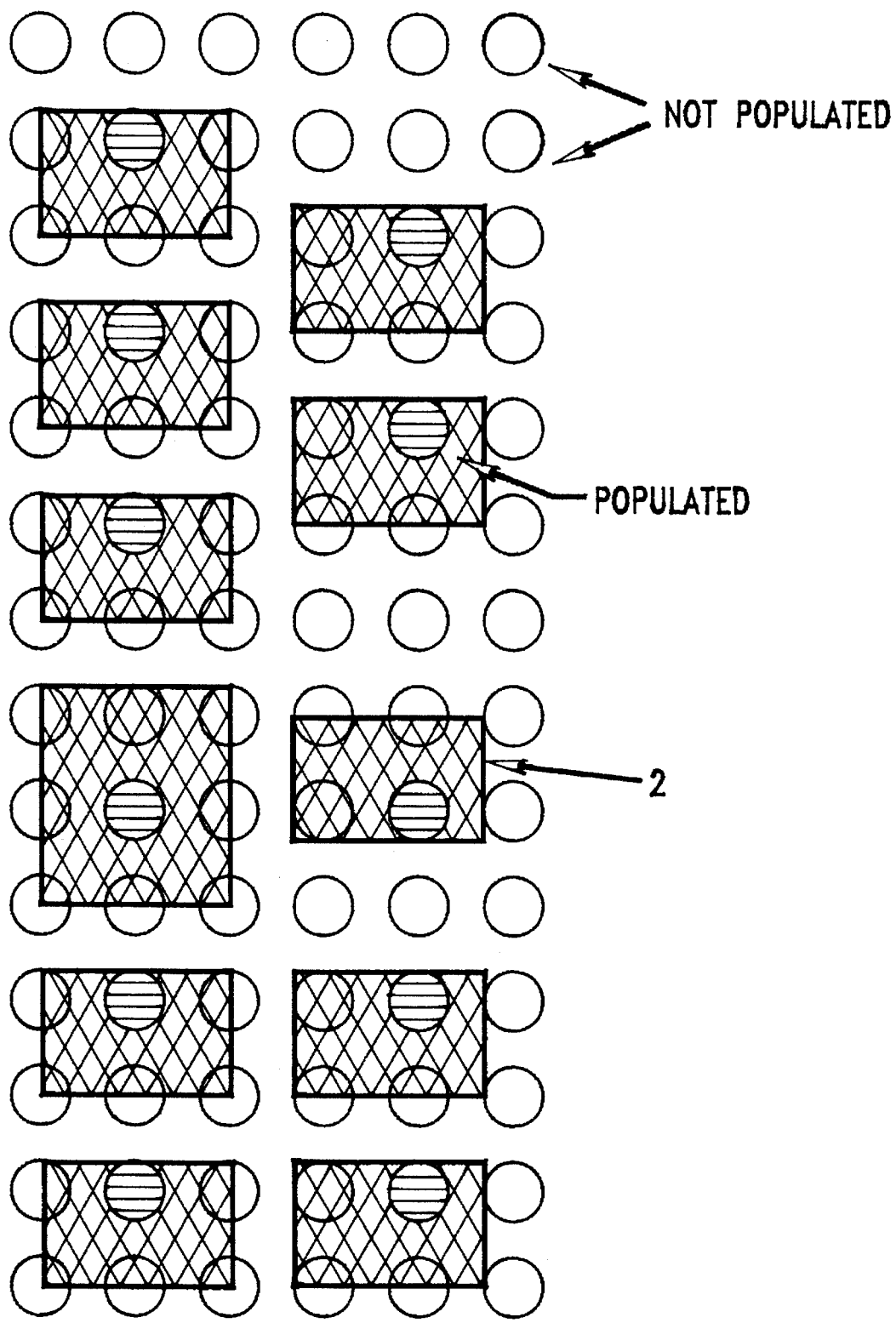
FIG. 5 shows a populating scheme wherein only selected compartments needed to test a special device are populated.
Figure 6:
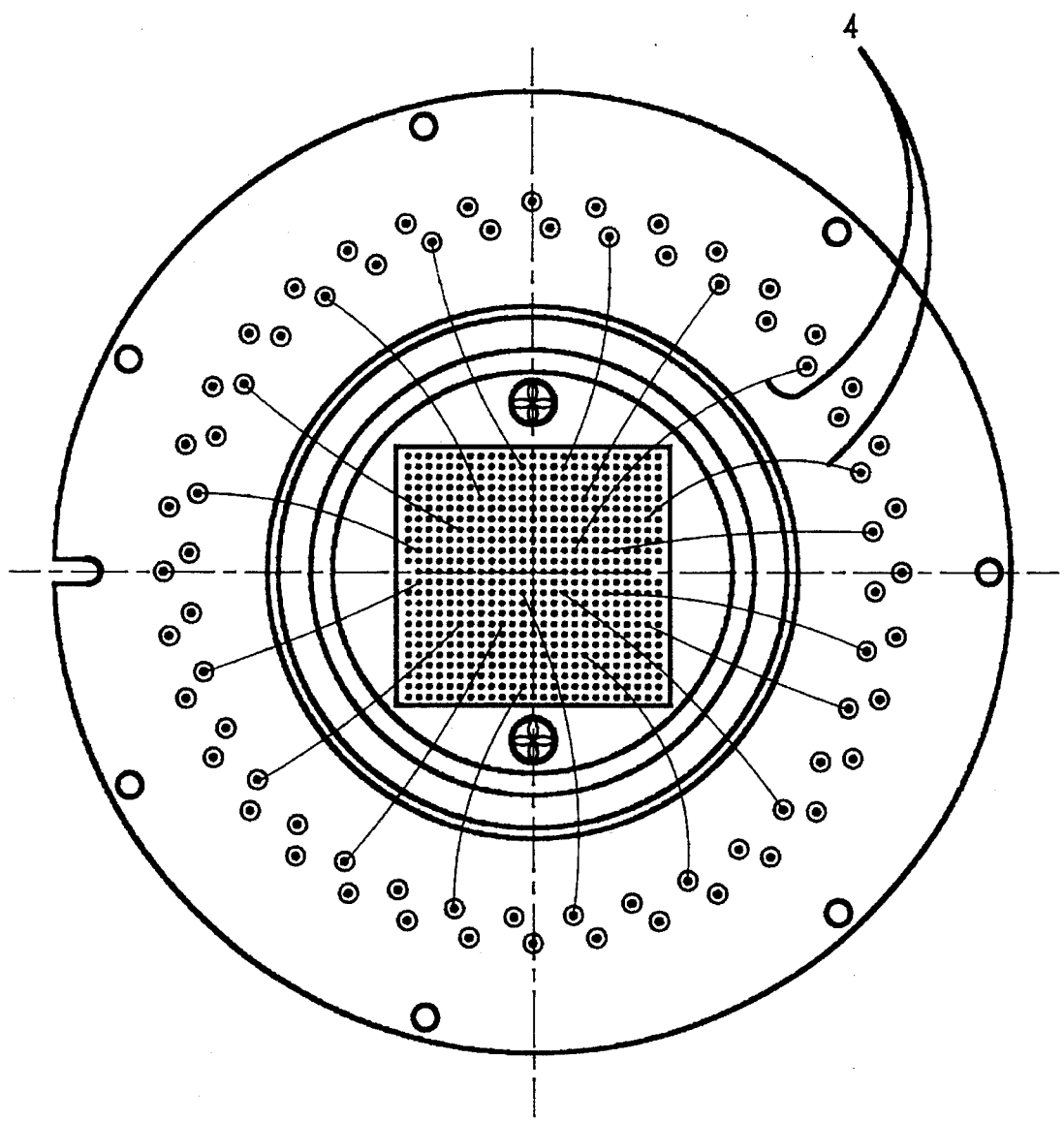
FIG. 6 shows a top view of the complete assembly according to the invention.

The assembly described in the invention permits high test signal speeds (within the GHz range) and frequencies. Furthermore, the test probe assembly in accordance with the present invention is designed with a capacity of accommodating in its respective compartments a full array of probes within a predetermined area (i.e. 20×20 mm). The typical spacing of the array is about 100 μm. This allows for 40,000 possible contacts. However, only those compartments are populated with the probes that are necessary to test the IC. This principle is shown in FIGS. 5 and 6. Theoretically, an IC could be tested having the size of 20×20 mm and including 40,000 contact pads.

Since at present only ICs are produced having a density of about 1/20 of this value, only every 20th compartment needs to be populated. When populating the compartments, it is usually one lying nearest to the pad-center pad to be tested that is chosen (FIG. 5). Thus, only one type of test assembly serving as a basis for all ICs needs to be manufactured. This test probe assembly is "personalized" in accordance to its respective population.

In this disclosure, there is shown and described only the preferred embodiment of the invention. It should, however, be understood that the invention is capable of changes or modifications within the scope of the invention concept as expressed herein.

What is claimed is:

1. A buckling beam test probe assembly for electrically testing a device provided with a plurality of contact pads, comprising:

current carrying electrically conductive contact probes, each of said probes including an inner core surrounded by an outer sheath, each of said probes comprising a plurality of fibers protruding from said core;

a stack of perforated plates, wherein each of said probes passes through one perforation in each of said perforated plates; and a stripper plate positioned under said perforated plates, comprised of sections that are offset with respect to each other, said stripper plate being further provided with guiding channels so that probes passing through said guiding channels are deflected laterally by an amount determined by said offset and by the diameter of said channels, thereby providing each of said probes with controllable wiping of said contact pads.

2. The test probe assembly as recited in claim 1, wherein said stripper plate further comprises an upper and a lower section, wherein the lower section is offset with respect to the upper section.

3. The test probe assembly as recited in claim 1, wherein said perforated plates and said stripper plates are made of a polymeric material.

4. The test probe assembly as recited in claim 1, wherein said stripper plate is made of silicon.

5. The test probe assembly as recited in claim 1, wherein the sheath surrounding the core is made of a highly electrically conductive material.

6. The test probe assembly as recited in claim 1, wherein the core is made of CuBe.

7. The test probe assembly as recited in claim 1, wherein said fibers protruding at one end from said core sweep at said end the surface of said contact pad.

8. The test probe assembly as recited in claim 7, wherein said fibers are made of AgPb.

9. The test probe assembly as recited in claim 7, wherein said fibers each have a diameter ranging from 2 to 10 micrometers.

10. The test probe assembly as recited in claim 7, wherein said assembly is solely supported on the device to be tested by stand-offs.

11. The test probe assembly as recited in claim 10, wherein said stand-offs are arranged in the same formation as the contact pads on the device to be tested.

12. The test probe assembly as recited in claim 10, wherein said stand-offs have the same height as the contact probes.

13. The test probe assembly as recited in claim 1, wherein said assembly further comprises contact probes in a number that matches the maximum number of contact probes of any device under test.

14. The test probe assembly as recited in claim 1, wherein said assembly further comprises compartments formed by the perforations in said stack of perforated plates and in said stripper plate, said compartments permitting the arrangement of contact probes in an array formation having a surface approximately 100 square micrometers, thereby allowing contacting a maximum of 40,000 pads.

15. The test probe assembly as recited in claim 1, wherein said core is surrounded by an etch stop layer.

16. The test probe assembly as recited in claim 15, wherein said etch stop layer is a thin layer of nickel.

17. The test probe assembly as recited in claim 1, each of said probes is insulated by a polyimide insulation layer.

18. The test probe assembly as recited in claim 15, wherein said nickel layer is surrounded by an electrical conductive sheath.

* * * * *